(12) United States Patent
Brennan et al.

(10) Patent No.: US 7,164,200 B2
(45) Date of Patent: Jan. 16, 2007

(54) TECHNIQUES FOR REDUCING BOWING IN POWER TRANSISTOR DEVICES

(75) Inventors: John McKenna Brennan, Wyomissing, PA (US); Joseph Michael Freund, Fogelsville, PA (US); John William Osenbach, Kutztown, PA (US)

(73) Assignee: Agere Systems Inc., Allentown, PA (US)

( * ) Notice: Subject to any disclaimer, the term of this patent is extended or adjusted under 35 U.S.C. 154(b) by 163 days.

(21) Appl. No.: 10/788,678

(22) Filed: Feb. 27, 2004

(65) Prior Publication Data
US 2005/0189616 A1  Sep. 1, 2005

(51) Int. Cl.
*H01L 23/10* (2006.01)
*H01L 23/34* (2006.01)

(52) U.S. Cl. .................. 257/707; 257/728
(58) Field of Classification Search .......... 257/728, 257/275, 776, 341, 747, 707; 438/119, 122
See application file for complete search history.

(56) References Cited

U.S. PATENT DOCUMENTS

| | | | |
|---|---|---|---|
| 4,784,973 A | 11/1988 | Stevens et al. | |
| 5,089,438 A | 2/1992 | Katz | |
| 5,236,868 A | 8/1993 | Nulman | |
| 5,254,499 A | 10/1993 | Sandhu et al. | |
| 5,278,100 A | 1/1994 | Doan et al. | |
| 5,399,379 A | 3/1995 | Sandhu | |
| 5,612,253 A | 3/1997 | Farahani et al. | |
| 5,967,878 A | 10/1999 | Arcona et al. | |
| 6,194,773 B1 * | 2/2001 | Malhi | 257/502 |
| 6,306,761 B1 | 10/2001 | Taguchi | |
| 6,465,272 B1 | 10/2002 | Davis, Jr. et al. | |
| 2002/0125566 A1 * | 9/2002 | Tonami et al. | 257/728 |
| 2003/0098704 A1 | 5/2003 | Du-Nour et al. | |

FOREIGN PATENT DOCUMENTS

EP    1 436 434    5/1976

OTHER PUBLICATIONS

U.S. Appl. No. 10/628,941, filed Jul. 29, 2003, Fratti et al.
Stroud et al., "Effect of Bow-Type Initial Imperfection on Reliability of Minimum-Weight Stiffened Structural Panels," NASA Technical Paper 3263, 1-24, (Jan. 1993).

* cited by examiner

*Primary Examiner*—Phat X. Cao

(57) ABSTRACT

Power transistor devices and techniques for reducing bowing in such devices are provided. In one aspect, a power transistor device is provided. The power transistor device comprises a substrate, a device film formed on the substrate and an adhesion layer formed on a side of the substrate opposite the device film, wherein at least a portion of the adhesion layer is at least partially segmented. The power transistor device thereby exhibits a reduced amount of bowing relative to an amount of bowing expected without the segmenting of the adhesion layer. The power transistor device may be part of an integrated circuit.

20 Claims, 3 Drawing Sheets

TECHNIQUES FOR REDUCING BOWING IN POWER TRANSISTOR DEVICES

CROSS-REFERENCE TO RELATED APPLICATIONS

The present invention is related to U.S. patent application Ser. No. 10/628,941, filed on Jul. 29, 2003, and entitled "Techniques for Curvature Control in Power Transistor Devices," the disclosure of which is hereby incorporated by reference.

FIELD OF THE INVENTION

The present invention relates generally to power transistor devices, and more particularly to techniques for reducing bowing experienced in such devices.

BACKGROUND OF THE INVENTION

Power transistor devices, e.g., radio frequency (RF) power transistors, operate at a high junction temperature. It is desirable for power transistor device assemblies to have a high thermal conductivity for proper performance and reliability. Thus, efforts are made during the processing of such power transistor devices to ensure that proper thermal coupling exists between a given device and a heat sink upon which the device is typically mounted, so that sufficient heat removal is attained.

The use of an ultra-thin device, achieved by thinning or otherwise processing the device substrate, is one technique employed to improve the thermal conductivity and thus enhance device performance. However, due to the thinning of the substrate and to stresses associated with device components, bowing of the device often occurs. Bowing presents an issue for handling and attaching the device, e.g., to the heat sink. More specifically, a bowed device is difficult to pick up, place and attach with a uniform and planar bondline.

Typically, reflow mounting is used to solder a power transistor device to a heat sink. Metals are often deposited on the substrate to provide a robust surface for attachment to the heat sink. For example, a titanium (Ti)-containing adhesion layer, deposited directly on the back side of the substrate, is commonly used for a number of solder systems. However, these metals, and Ti in particular, have high inherent stresses that only add to the bowing of the device.

Bowing of the device may cause voids to form between the device and the heat sink, resulting in an unfavorable and non-uniform mating of surfaces, and thus inadequate heat removal characteristics. Accordingly, there exists a need for power transistor devices which exhibit a reduced amount of bowing.

SUMMARY OF THE INVENTION

The present invention provides power transistor devices and techniques for reducing bowing in such devices. In one aspect of the invention, a power transistor device is provided. The power transistor device comprises a substrate, a device film formed on the substrate and an adhesion layer formed on a side of the substrate opposite the device film, wherein at least a portion of the adhesion layer is at least partially segmented. The power transistor device thereby exhibits a reduced amount of bowing relative to an amount of bowing expected without the segmenting of the adhesion layer. The power transistor device may be part of an integrated circuit.

In another aspect of the invention, a method of processing a power transistor device is provided. In the method, a device film is formed on a substrate, an adhesion layer is formed on a side of the substrate opposite the device film, and at least a portion of the adhesion layer is at least partially segmented. The power transistor device thereby exhibits a reduced amount of bowing relative to an amount of bowing expected without the segmenting of the adhesion layer.

DETAILED DESCRIPTION

Figure 1:
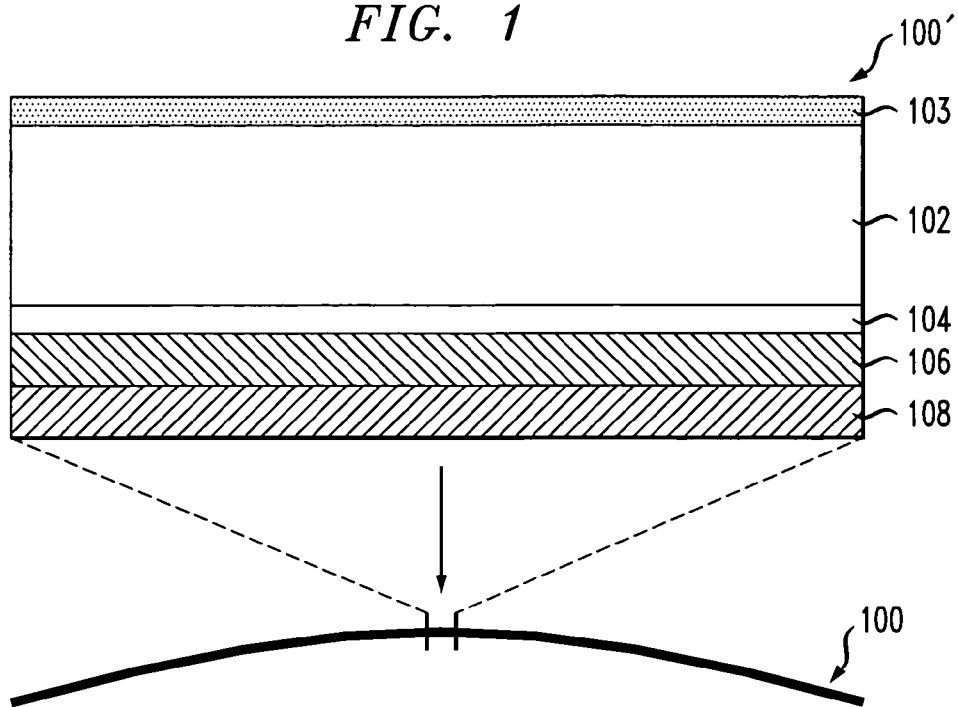
FIG. 1 illustrates a power transistor device configuration having a blanket adhesion layer.

FIG. 1 illustrates one possible power transistor device configuration, namely a power transistor device having a blanket adhesion layer. In FIG. 1, a cross-section 100' of power transistor device 100 comprises device film 103, substrate 102 and blanket adhesion layer 104. As shown in FIG. 1, power transistor device 100 may also comprise additional metal layers, e.g., metal layers 106 and 108 which may be implemented, for example, in attaching power transistor device 100, e.g., by soldering to a metal heat sink.

For example, metal layer 106 may comprise a barrier material that prevents any species present in blanket adhesion layer 104 from migrating into, e.g., metal layer 108. Metal layer 108 may comprise a wettable material compatible with soldering attachment techniques. Accordingly, metal layer 106, when comprising a barrier material, can prevent blanket adhesion layer 104 species from migrating into and contaminating the wettable material of metal layer 108. As is described below, species that migrate into and contaminate the wettable material may undergo oxidation and interfere with attachment of power transistor device 100.

Accordingly, the power transistor device configuration shown in FIG. 1 comprises device film 103 on a side of substrate 102. Blanket adhesion layer 104 is present on a side of substrate 102 opposite device film 103. Metal layer 106 is present on a side of blanket adhesion layer 104 opposite substrate 102. Metal layer 108 is present on a side of metal layer 106 opposite blanket adhesion layer 104.

Certain stresses are inherent in blanket adhesion layer 104, as well as in metal layers 106 and 108. For example, stresses present in a 1,000 angstrom (Å) thick titanium (Ti) blanket adhesion layer may be greater than or equal to about $1 \times 10^{10}$ dynes per square centimeter (dynes/cm$^2$), and in fact are typically greater than or equal to about $1 \times 10^{11}$ dynes/cm$^2$.

These stresses, if not counterbalanced, can cause power transistor device 100 to bow. At least a portion of the stresses inherent in the layers may be counterbalanced through the use of a robust substrate which resists curvature. However, having a robust substrate can negatively affect the thermal properties of the device.

Thinning the substrate, e.g., by chemical-mechanical polishing (CMP) processing, can improve the thermal properties of the device, but at the same time reduce the ability of the substrate to counterbalance the stresses inherent in the layers. As a result, the power transistor device bows after such processing is performed.

The amount of stress present in an adhesion layer is independent of the thickness of the layer. However, factors such as layer thickness and substrate thickness do affect bowing of the device. Namely, the magnitude of the bowing is directly proportional to the thickness of the adhesion layer, and inversely proportional to the thickness of the substrate. For example, for a given substrate thickness, reducing the adhesion layer thickness from about 1,000 Å to about 500 Å reduces the amount of bowing experienced in the device by a factor of two. Bowing makes handling and attachment of the device, e.g., on a heat sink, difficult.

Figure 2:
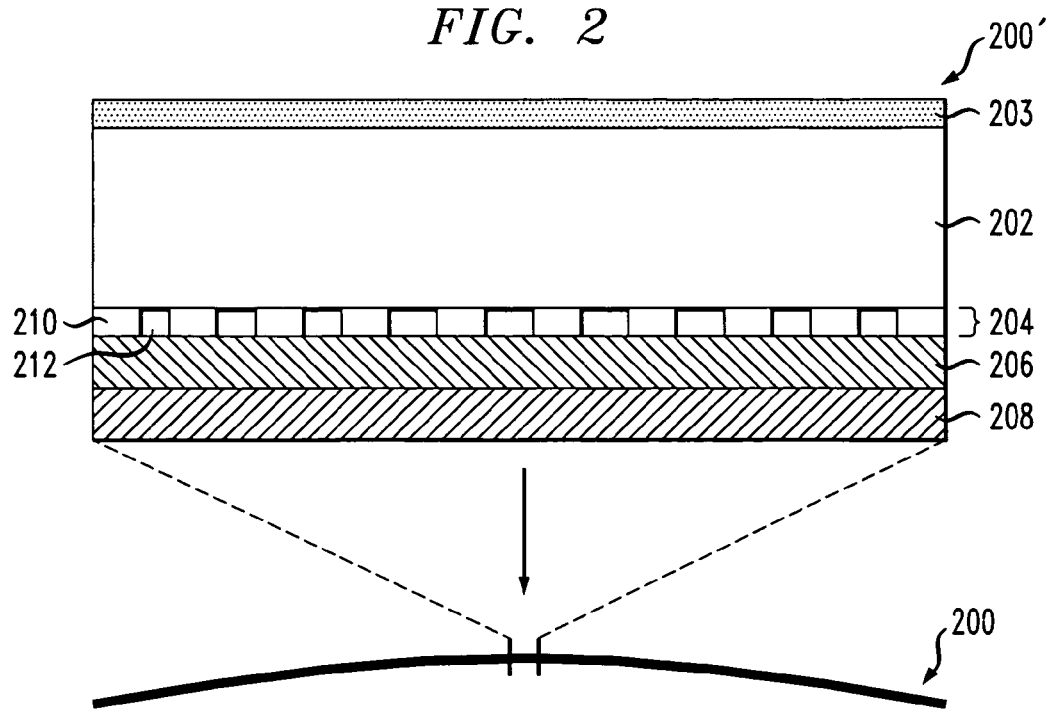
FIG. 2 illustrates a power transistor device configuration having a segmented adhesion layer.

FIG. 2 illustrates a power transistor device configuration having a segmented adhesion layer according to an exemplary embodiment of the present invention. Namely, in FIG. 2, a cross-section 200' of power transistor device 200 comprises device film 203, substrate 202, segmented adhesion layer 204, barrier layer 206 and wettable-surface layer 208. Specifically, power transistor device 200 comprises device film 203 formed on a side of substrate 202. Segmented adhesion layer 204 is present on a side of substrate 202 opposite device film 203. Barrier layer 206 is present on a side of segmented adhesion layer 204 opposite substrate 202. Wettable-surface layer 208 is present on a side of barrier layer 206 opposite segmented adhesion layer 204.

Device film 203 is typically present as a layer, e.g., formed, on a surface of substrate 202. The term "device film" as used herein is intended to include any arrangement of one or more material layers which forms at least a portion of a power transistor device.

Substrate 202 may comprise any suitable semiconductor substrate material, including, but not limited to, silicon. As described above, to enhance the thermal properties of power transistor device 200, substrate 202 may be processed. For example, substrate 202 may be subject to chemical-mechanical polishing, wherein the thickness of substrate 202 is reduced.

The amount of bowing experienced by power transistor device 200, as compared to power transistor device 100 shown in FIG. 1 above, is reduced. The reduced bowing is attributable to the configuration of segmented adhesion layer 204. Namely, an amount of bowing experienced by power transistor device 200 may be reduced or substantially eliminated by segmenting the adhesion layer, as will be described in detail below.

The term "segmented," as used herein, is meant to include any configuration wherein at least a portion of a layer is at least partially non-continuous along a lateral dimension thereof. For example, segmented adhesion layer 204 may comprise a uniformly segmented layer having evenly spaced and distinct islands 210 separated by voids 212, such as in the configuration shown in FIG. 2.

Alternatively, segmented adhesion layer 204 may comprise a non-uniformly segmented layer having islands 210 variably spaced laterally within the layer. As another example, the voids may be of different heights and widths, and a given void need not extend through the entire layer thickness. Numerous other types of segmenting of the adhesion layer 204 may be used to provide reduced bowing in accordance with the invention. Different segmenting conformations may be produced in accordance with the techniques provided in detail below.

The term "island," as used herein, denotes a distinct portion or segment of a layer at least partially separated from other portions of the layer, e.g., as compared to a blanket layer. Thus, for example, segmented adhesion layer 204 may comprise adhesive metallic material, as will be described in detail below, arranged in distinct islands 210 at least partially separated from each other by voids 212.

Segmented adhesion layer 204 may comprise any suitable adhesive metallic material, including, but not limited to, Ti, nickel (Ni) and combinations comprising at least one of the foregoing adhesive metallic materials. In an exemplary embodiment, segmented adhesion layer 204 comprises Ti. Segmented adhesion layer 204 may have a thickness of less than or equal to about 1,000 nanometers (nm). For example, segmented adhesion layer 204 may have a thickness of between about 100 Å to about 1,000 nm.

Further, voids 212 may extend fully through segmented adhesion layer 204, such as in the configuration shown in FIG. 2. Alternatively, as indicated above, one or more of voids 212 may extend only a part of the way through segmented adhesion layer 204. Also, according to the techniques presented herein, segmented adhesion layer 204 may comprise a single void 212 that extends at least a part of the way through segmented adhesion layer 204.

Each of voids 212 may be free of material, or alternatively, may comprise a low stress material. When one or more of voids 212 are free of material, each such void comprises a space, e.g., between islands 210. When one or more of voids 212 comprise a low stress material, the low stress material is typically a low stress polymer. The term "low stress material" is intended to include, without limitation, any material, including a low stress polymer, having an inherent stress of less than or equal to about $2 \times 10^9$ dynes/cm$^2$.

As was mentioned above, bowing of power transistor device 200 may be reduced by segmenting the adhesion layer. Namely, by segmenting the adhesion layer, the stress present in that layer (typically in the range of between about $1 \times 10^{10}$ dynes/cm$^2$ to about $1 \times 10^{11}$ dynes/cm$^2$, as described above) is apportioned over the dimensions of each segment, e.g., island, of the layer, rather than to a single blanket layer.

The amount of bowing experienced in a power transistor device having a segmented adhesion layer may be quantified using the following equation:

$$\frac{T_s^2}{\left[ T_{adhesion} \frac{area_{adhesion}}{area_D} \right]}$$

wherein $T_S$ is the substrate thickness, $T_{adhesion}$ is the segmented adhesion layer thickness, area$_{adhesion}$ is the average total surface area of each of the segments in the adhesion layer and area$_D$ is the total surface area of the power transistor device. For example, segmenting a 1,000 Å thick adhesion layer for a power transistor device having a 50 micrometer (μm) thick substrate can effectively apportion the overall stress inherent to the adhesion layer to distinct segments, and thereby reduce bowing of the device by up to a factor of two.

Barrier layer 206 and wettable-surface layer 208 may also contribute to bowing of the device, and as such, barrier layer 206 and/or wettable-surface layer 208 may also be segmented as is described in detail below. However, according to the techniques presented herein, having segmented adhesion layer 204 as the only segmented layer of power transistor device 200, reduces bowing sufficiently to allow for proper handling and attaching of power transistor device 200, e.g., to a heat sink.

Barrier layer 206 may comprise any suitable barrier metal, including, but not limited to, platinum (Pt), niobium (Nb) and combinations comprising at least one of the foregoing barrier metals. Barrier layer 206 prevents materials present in segmented adhesion layer 204, e.g., Ti, from diffusing through wettable-surface layer 208 and oxidizing on the surface of wettable-surface layer 208. The presence of oxidized materials on wettable-surface layer 208 will affect the attachment of solder to the device. Further, barrier layer 206 prevents any reaction from occurring between the materials present in segmented adhesion layer 204 and wettable-surface layer 208.

While barrier layer 206 is shown in FIG. 2 as a continuous, blanket layer, according to the techniques presented herein, barrier layer 206 might be uniformly or non-uniformly segmented, with voids extending at least a part of the way through the layer. Barrier layer 206 may have a thickness of less than or equal to about 200 nm. For example, barrier layer 206 may have a thickness of about 180 nm.

Power transistor device 200, in the FIG. 2 embodiment, further comprises wettable-surface layer 208 deposited on a side of barrier layer 206 opposite segmented adhesion layer 204. Wettable-surface layer 208 may comprise any metal that does not oxidize and that does not intermix with solders that may be employed to attach power transistor device 200, e.g., to a metal heat sink. Suitable metals include, but are not limited to, gold (Au), tin (Sn), silver (Ag), lead (Pb), germanium (Ge), bismuth (Bi), indium (In) and combinations comprising at least one of the foregoing metals.

While wettable-surface layer 208 is shown in FIG. 2 as a continuous, blanket layer, according to the techniques presented herein, wettable-surface layer 208 might be uniformly or non-uniformly segmented, with voids extending at least part of the way through the layer. Wettable-surface layer 208 may have a thickness of less than or equal to about 200 nm. For example, wettable-surface layer 208 may have a thickness of about 180 nm.

It is to be appreciated that power transistor device 200 may be implemented as part of an integrated circuit, or in other implementations.

Figure 3:
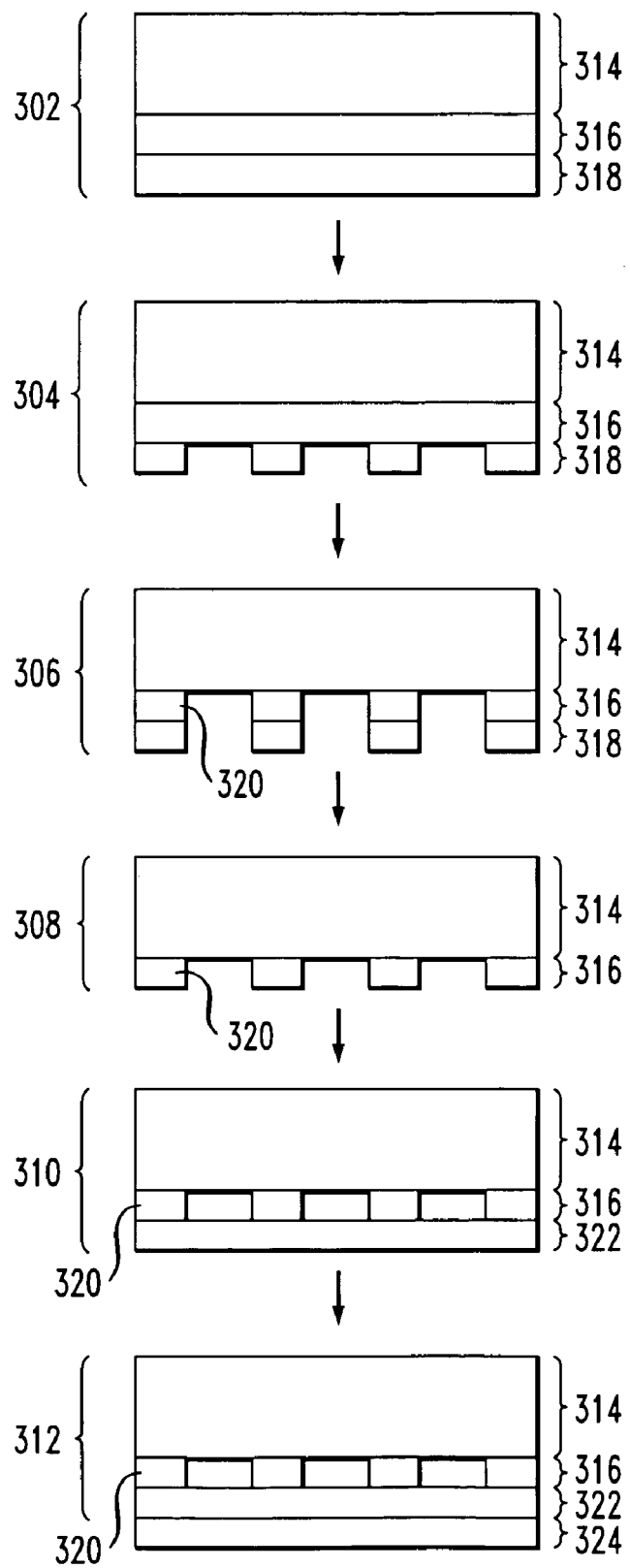
FIG. 3 illustrates an exemplary technique for producing a power transistor device having a segmented adhesion layer.

FIG. 3 is a diagram of an exemplary technique for producing a power transistor device having a segmented adhesion layer. In step 302 of FIG. 3, metallic material, e.g., Ti and/or Ni, is deposited on a surface of substrate 314 using standard deposition techniques to form adhesion layer 316. Suitable deposition techniques include, but are not limited to, sputtering, electron beam deposition and combinations comprising at least one of the foregoing deposition techniques. In an exemplary embodiment, adhesion layer 316 is sputtered onto substrate 314.

Photoresist material is then deposited on adhesion layer 316 using standard deposition techniques to form photoresist layer 318. Suitable deposition techniques include, but are not limited to, sputtering, electron beam deposition and combinations comprising at least one of the foregoing deposition techniques. In an exemplary embodiment, photoresist layer 318 is sputtered onto adhesion layer 316.

In step 304 of FIG. 3, photoresist layer 318 is patterned using standard lithography techniques, including, but not limited to electron beam lithography. In step 306 of FIG. 3, the pattern from photoresist layer 318 is transferred to adhesion layer 316 using standard lithography techniques, including, but not limited to electron beam lithography. As such, islands 320 are formed in adhesion layer 316. In step 308, photoresist layer 318 (of steps 302–306) has been removed, revealing adhesion layer 316 now having distinct segmentation therein.

In step 310 of FIG. 3, barrier layer 322 is deposited on adhesion layer 316. Barrier layer 322 may be deposited using any suitable deposition techniques, including, but not limited to, sputtering, evaporation deposition and combinations comprising at least one of the foregoing deposition techniques.

In step 312 of FIG. 3, wettable-surface layer 324 is deposited on barrier layer 322. Wettable-surface layer 324 may be deposited using any suitable deposition techniques, including, but not limited to, sputtering, evaporation deposition and combinations comprising at least one of the foregoing deposition techniques.

The particular steps shown in FIG. 3 are presented by way of example only, and should not be construed as requirements of the invention. Similarly, the materials, dimensions and other characteristics associated with particular device layers and other elements may be varied in alternative embodiments.

Figure 4A:
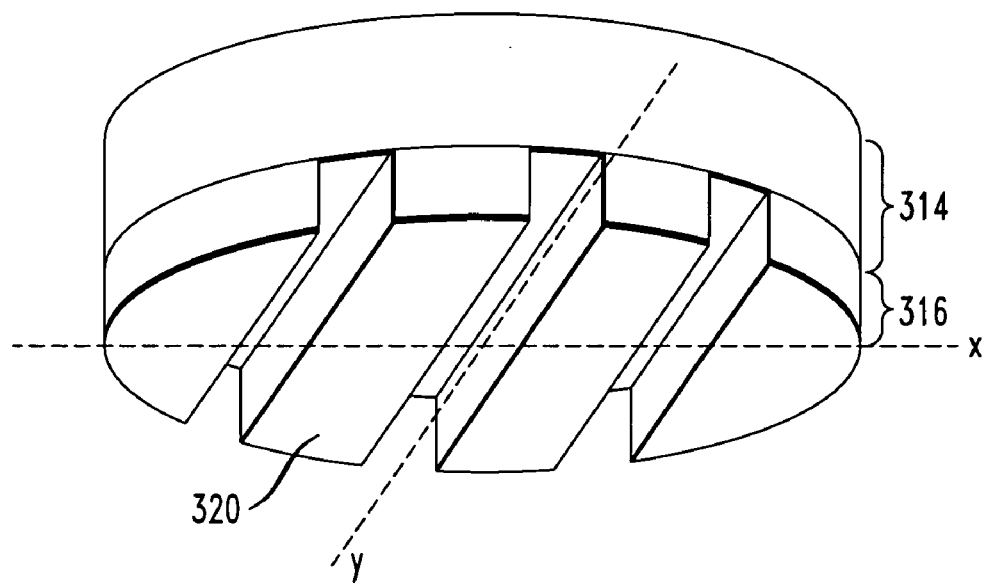
FIGS. 4A–B illustrate exemplary adhesion layer configurations.

The techniques depicted in step 302 through step 308 of FIG. 3, described above, show patterning of the adhesion layer along a single axis of the device. FIG. 4A illustrates a power transistor device wherein an adhesion layer, e.g., adhesion layer 316, is patterned along a single axis of the device, i.e., along the y-axis. The power transistor device of FIG. 4A shows only two layers, namely adhesion layer 316 formed on substrate 314, which is done to better illustrate the patterning of adhesion layer 316. It is to be understood, however, that the power transistor device may comprise one or more other layers, such as those depicted, for example, in FIG. 2, and may be processed according to the steps presented, for example, in FIG. 3. Segmenting adhesion layer 316 according to this particular embodiment would result in islands 320 comprising strips of adhesive metallic material that make up adhesion layer 316.

The power transistor device shown depicted in FIG. 4A has a circular shape. However, according to the techniques presented herein, the power transistor device may have any suitable shape, including, but not limited to, a circular shape.

Figure 4B:
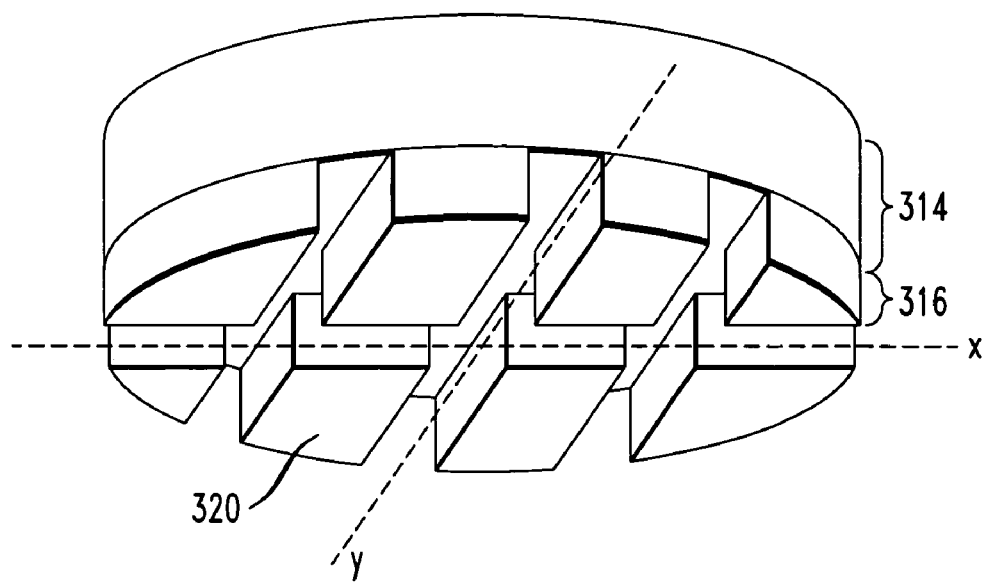

The techniques presented herein are however not limited to any particular patterning configuration. For example, patterning of the adhesion layer may occur along multiple axes of the device. FIG. 4B illustrates a power transistor device wherein an adhesion layer, e.g., adhesion layer 316, is patterned along two intersecting axes of the device, i.e., along the x-axis and y-axis. Segmenting adhesion layer 316 according to this particular embodiment would result in islands 320 comprising divided strips.

Thus, although illustrative embodiments of the present invention have been described herein, it is to be understood that the invention is not limited to those precise embodiments, and that various other changes and modifications may be made by one skilled in the art without departing from the scope or spirit of the invention.

What is claimed is:

1. A power transistor device comprising:

a substrate;

a device film formed on the substrate; and an adhesion layer formed on a side of the substrate opposite the device film, wherein at least a portion of the adhesion layer is at least partially segmented and configured to be thermally coupled to a heat sink;

the power transistor device thereby exhibiting a reduced amount of bowing relative to an amount of bowing expected without the segmenting of the adhesion layer.

2. The device of claim 1, wherein the adhesion layer comprises a material selected from the group consisting of titanium, nickel and combinations comprising at least one of the foregoing materials.

3. The device of claim 1, wherein the adhesion layer comprises material arranged in distinct segments, each segment being at least partially separated from other segments of the adhesion layer.

4. The device of claim 3, wherein voids between one or more of the segments are substantially free of material.

5. The device of claim 3, wherein voids between one or more of the segments comprise a low stress material.

6. The device of claim 5, wherein the low stress material comprises a low stress polymer.

7. The device of claim 1, wherein the adhesion layer comprises material arranged in distinct segments that are uniformly spaced along the adhesion layer.

8. The device of claim 1, wherein the adhesion layer comprises material arranged in distinct segments that are non-uniformly spaced along the adhesion layer.

9. The device of claim 1, wherein the adhesion layer comprises one or more voids, at least one of which extends partially through the adhesion layer.

10. The device of claim 1, wherein the adhesion layer has a thickness of from about 100 angstroms to about 1,000 nanometers.

11. The device of claim 1, further comprising at least one additional metal-containing layer associated with a side of the adhesion layer opposite the substrate.

12. The device of claim 11, wherein one or more of the at least one additional metal-containing layer is segmented.

13. The device of claim 1, further comprising a barrier layer associated with a side of the adhesion layer opposite the substrate.

14. The device of claim 13, wherein the barrier layer comprises a metal selected from the group consisting of platinum, niobium and combinations comprising at least one of the foregoing metals.

15. The device of claim 1, further comprising a wettable-surface layer associated with a side of the adhesion layer opposite the substrate.

16. The device of claim 15, wherein the wettable-surface layer comprises a metal selected from the group consisting of gold, tin, silver, lead, germanium, bismuth, indium and combinations comprising at least one of the foregoing metals.

17. A method of processing a power transistor device, the method comprising the steps of:
    forming a device film on a substrate;
    forming an adhesion layer on a side of the substrate opposite the device film; and
    at least partially segmenting at least a portion of the adhesion layer and configured to be thermally coupled to a heat sink, the power transistor device thereby exhibiting a reduced amount of bowing relative to an amount of bowing expected without the segmenting of the adhesion layer.

18. An integrated circuit, comprising:
    at least one power transistor device comprising:
        a substrate;
        a device film formed on the substrate; and
        an adhesion layer formed on a side of the substrate opposite the device film, wherein at least a portion of the adhesion layer is at least partially segmented and configured to be thermally coupled to a heat sink;
        the power transistor device thereby exhibiting a reduced amount of bowing relative to an amount of bowing expected without the segmenting of the adhesion layer.

19. The integrated circuit of claim 18, wherein the at least a portion of the adhesion layer is at least partially segmented by patterning along two or more intersecting axes of the power transistor device.

20. The integrated circuit of claim 18, wherein the adhesion layer comprises a material selected from the group consisting of titanium, nickel and combinations comprising at least one of the foregoing materials.

* * * * *